(12) United States Patent
Ronsisvalle et al.

(10) Patent No.: US 8,420,454 B2
(45) Date of Patent: Apr. 16, 2013

(54) THREE-TERMINAL POWER DEVICE WITH HIGH SWITCHING SPEED AND MANUFACTURING PROCESS

(75) Inventors: Cesare Ronsisvalle, San Giovanni la Punta (IT); Vincenzo Enea, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 79 days.

(21) Appl. No.: 13/017,982

(22) Filed: Jan. 31, 2011

(65) Prior Publication Data

US 2011/0129967 A1  Jun. 2, 2011

Related U.S. Application Data

(62) Division of application No. 12/301,448, filed as application No. PCT/IT2006/000372 on May 18, 2006, now Pat. No. 7,982,528.

(51) Int. Cl.
*H01L 21/332* (2006.01)

(52) U.S. Cl.
USPC ........... 438/135; 438/139; 438/151; 438/197; 438/199; 438/275; 438/585; 327/439; 327/440; 327/441; 327/474; 257/107; 257/115; 257/E21.388; 257/E21.389; 257/E21.39; 257/E29.036

(58) Field of Classification Search .................. None
See application file for complete search history.

(56) References Cited

U.S. PATENT DOCUMENTS

| | | |
|---|---|---|
| 4,199,774 A | 4/1980 | Plummer |
| 4,980,741 A | 12/1990 | Temple |
| 5,194,927 A | 3/1993 | Ueno |
| 5,319,221 A | 6/1994 | Ueno |
| 5,378,903 A | 1/1995 | Otsuki et al. |
| 5,757,034 A | 5/1998 | Ajit |
| 5,793,065 A * | 8/1998 | Shinohe et al. ............... 257/147 |

(Continued)

FOREIGN PATENT DOCUMENTS

| | | |
|---|---|---|
| EP | 0731508 | 9/1996 |
| EP | 1742272 | 1/2007 |
| WO | 02/075892 | 9/2002 |
| WO | 2004/102671 | 11/2004 |

OTHER PUBLICATIONS

International Search Report for International Patent Application Serial No. PCT/IT2006/000372; European Patent Office, Mar. 27, 2007.

*Primary Examiner* — Julio J Maldonado
*Assistant Examiner* — Yasser Abdelaziez
(74) *Attorney, Agent, or Firm* — Graybeal Jackson LLP

(57) ABSTRACT

An embodiment of a power device having a first current-conduction terminal, a second current-conduction terminal, a control terminal receiving, in use, a control voltage of the power device, and a thyristor device and a first insulated-gate switch device coupled in series between the first and the second conduction terminals; the first insulated-gate switch device has a gate terminal coupled to the control terminal, and the thyristor device has a base terminal. The power device is further provided with: a second insulated-gate switch device, coupled between the first current-conduction terminal and the base terminal of the thyristor device, and having a respective gate terminal coupled to the control terminal; and a Zener diode, coupled between the base terminal of the thyristor device and the second current-conduction terminal so as to enable extraction of current from the base terminal in a given operating condition.

19 Claims, 4 Drawing Sheets

U.S. PATENT DOCUMENTS

| | | |
|---|---|---|
| 6,118,141 A | 9/2000 | Xu et al. |
| 6,313,485 B1 | 11/2001 | Tihanyi |
| 6,326,648 B1 | 12/2001 | Jalade et al. |
| 6,933,541 B1 | 8/2005 | Huang |
| 6,952,335 B2 | 10/2005 | Huang et al. |
| 7,352,233 B1 | 4/2008 | Mueller et al. |

* cited by examiner

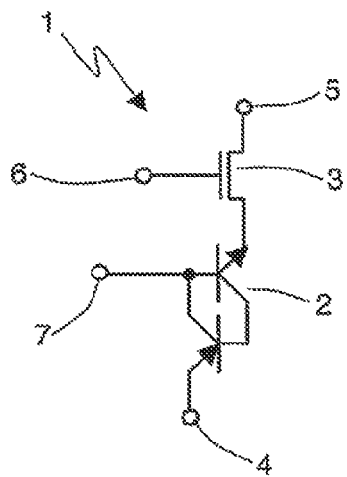
Fig.1 -Background Art
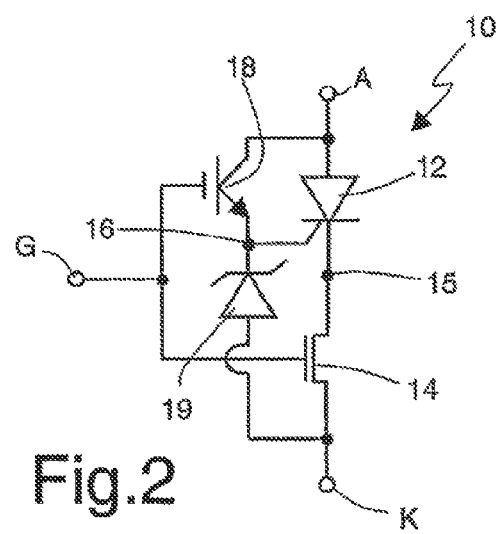
Fig.2
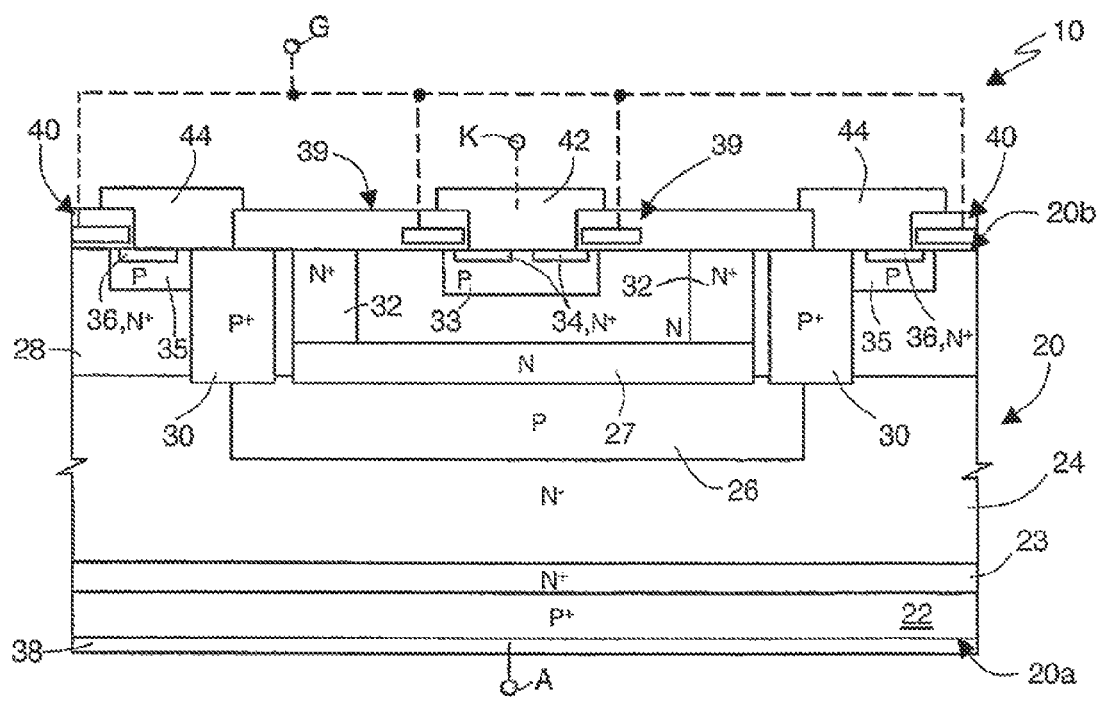
Fig.3

THREE-TERMINAL POWER DEVICE WITH HIGH SWITCHING SPEED AND MANUFACTURING PROCESS

PRIORITY CLAIM

The present application is a Divisional of U.S. patent application Ser. No. 12/301,448, filed Apr. 2, 2009 now U.S. Pat. No. 7,982,528 which is a United States national phase application filed pursuant to 35 USC §371 of International Patent Application Serial No. PCT/IT2006/000372, entitled THREE-TERMINAL POWER DEVICE WITH HIGH SWITCHING SPEED AND MANUFACTURING PROCESS, filed May 18, 2006; each of these applications is incorporated herein by reference in their entirety.

TECHNICAL FIELD

An embodiment of the present disclosure relates to a three-terminal power device, and in particular to a power device that can be used as high-voltage actuator.

BACKGROUND

As is known, in the last few years numerous power-actuator structures have been proposed in an endeavor to achieve characteristics such as low power dissipation, both during conduction (on-state) and during switching, high input impedance and high switching speed. In particular, the trend has been to pass from bipolar transistors (having low on-dissipation) and MOS transistors (having low dissipation during switching), to hybrid components that combine the advantages of both types of transistor. Amongst these, components have been proposed—such as IGBTs (Insulated-Gate Bipolar Transistors), MCTs (MOS-Controlled Thyristors), and ESTs (Emitter Switched Thyristors)—which, in addition to reaching different levels of compromise between power dissipation during the on-state and during switching, envisage driving via an insulated-gate electrode.

Amongst the hybrid solutions proposed, the ones that have proven particular advantageous, for example because they enable a high blocking voltage (which is the maximum reverse voltage that the device can withstand without undergoing breakdown), are those based upon thyristors, which have a reduced forward voltage drop during operation, and which are driven as MOSFETs, i.e., with a control voltage applied to an insulated gate. Belonging to said category are MCTs and ESTs, which, however, have a somewhat modest reverse-bias safe-operating area (RBSOA) and long turn-off times.

In order to solve said problems, in the patent application No. WO2004102671 filed on May 19, 2003 and incorporated by reference, a power device with high switching speed based upon a thyristor has been proposed. In particular, said power device, designated by 1 in FIG. 1, comprises a thyristor 2 and a MOSFET 3 coupled in series between two current-conduction terminals 4, 5. The power device/also has a driving terminal 6, which is coupled to an insulated-gate electrode of the MOSFET 3 and receives a voltage for turning on or off the device, and a further terminal 7 coupled to the thyristor 2, for fast extraction of charges during the turn-off of the device. In this way, upon turn-off, no current tails occur, and turn-off is very rapid. In addition, the power device does not have any parasitic components and so has a large RBSOA.

Although advantageous for the aforesaid reason, the power device 1 has, however, the drawback of not being of a standard type, in so far as it has four terminals (two control terminals and two current-conduction terminals), unlike the majority of power actuators, which have three terminals (one control terminal and two current-conduction terminals).

SUMMARY

An embodiment of the present disclosure is a power device that will enable the above drawbacks to be overcome and that will constitute a further improvement of power devices of a known type.

BRIEF DESCRIPTION OF THE DRAWINGS

For a better understanding of the subject matter discussed herein, one or more embodiments thereof are now described, purely by way of non-limiting example and with reference to the attached drawings, wherein:

FIG. 1 shows a circuit diagram of a power device of a known type;

FIG. 2 shows a circuit diagram of a power device according to an embodiment of the present disclosure;

FIG. 3 shows a cross section through an elementary structure of the power device of FIG. 2;

DETAILED DESCRIPTION

Figure 4:
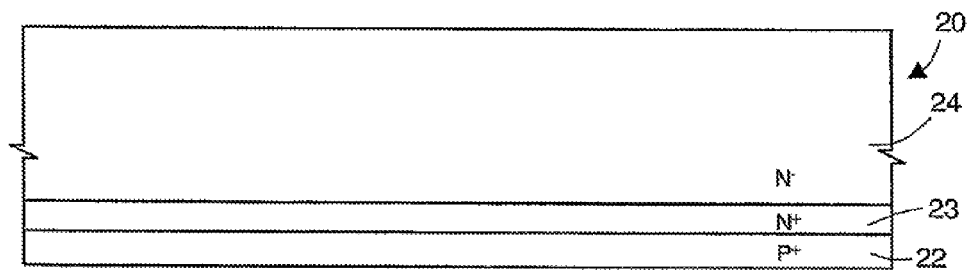
FIGS. 4-8 show cross sections through a wafer of semiconductor material, in successive manufacturing steps of the power device of FIG. 3.
Figure 5:
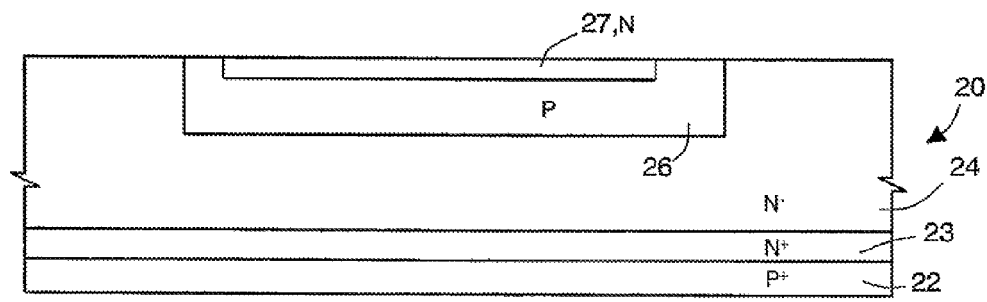

As shown in the equivalent electrical diagram of FIG. 2, a power device 10 according to an embodiment of the present disclosure has three terminals, and in particular a first current-conduction terminal A (anode), a second current-conduction terminal K (cathode), and a control terminal G (gate) for supplying a turn-on/turn-off voltage to the device.

The power device 10 comprises a thyristor 12 (in particular, a silicon controlled rectifier—SCR), and a first insulated-gate switch device 14 (in particular a MOS transistor), coupled in series between the first and second current-conduction terminals A, K. In detail, the thyristor 12 has its anode coupled to the first current-conduction terminal A, its cathode coupled to a first internal node 15, and its base coupled to a second internal node 16. The first insulated-gate switch device 14 is coupled between the first internal node 15 and the second current-conduction terminal K, and has its gate terminal coupled to the control terminal G of the power device 10.

The power device 10 further comprises: a second insulated-gate switch device 18 (in particular a high-voltage IGBT), which is coupled between the first current-conduction terminal A and the second internal node 16 and has its gate terminal which is also coupled to the control terminal G, and hence is coupled to the gate terminal of the first insulated-gate switch device 14; and a Zener diode 19, which is coupled between the second internal node 16 and the second current-conduction terminal K and in particular has its anode coupled to the second current-conduction terminal and its cathode coupled to the second internal node 16.

FIG. 3 shows a cross section of an embodiment of an elementary structure of the power device 10, provided as monolithic structure integrated in a single body of semiconductor material 20. The power device 10 may comprise in general a plurality of elementary structures arranged alongside one another, extending parallel to one another for example in a horizontal direction orthogonal to the vertical section of FIG. 3, and each elementary structure may comprise one or more elementary cells. In the illustrated embodiment, the elementary structure comprises one elementary cell.

In detail, the body of semiconductor material 20 has a bottom surface 20a and a top surface 20b and comprises: a substrate 22, of a P$^+$ type; a buffer layer 23, of an N$^+$ type, which is arranged on the substrate 22 and has the function of increasing, in a per-se known manner, the breakdown voltage of the device; a first base region, referred to hereinafter as drift region 24, of an N$^-$ type, arranged on the buffer layer 23; a second base region, referred to hereinafter as base region 26, of a P type, housed within the drift region 24; a cathode region 27, of an N type, arranged on the base region 26; and an epitaxial region 28, of an N$^-$ type. The epitaxial region 28 houses: first well regions 30, of a P$^+$ type, set partially in contact with the base region 26; second well regions 32, of an N$^+$ type, set in contact with the cathode region 27 and arranged beside and internally to the first well regions 30; first body regions 33, of a P type, housing first source regions 34, of an N$^+$ type, and arranged internally to the second well regions 32; and second body regions 35, of a P type, housing second source regions 36, of an N$^+$ type, and arranged externally to, and in contact with, the first well regions 30.

In greater detail, the bottom surface 20a of the power device 1, defined by the substrate 22, is covered by a metal layer 38 coupled to the first current-conduction terminal A, accessible from outside the power device 10. The drift region 24 is formed by a layer not accessible from outside, grown epitaxially, as explained in greater detail hereinafter, the characteristics (in terms of thickness and resistivity) of which depend upon the voltage class of the power device 10. The base region 26 is a buried region, coupled to the top surface 20b via the first well regions 30, which extend through the epitaxial region 28 between the top surface 20b and the base region 26. The cathode region 27 is a buried region, coupled to the top surface 20b via the second well regions 32, which extend through the epitaxial region 28 between the top surface 20b and the cathode region 27, and is delimited laterally by the first well regions 30, without necessarily being contiguous thereto. The epitaxial region 28 may have the same resistivity as the drift region 24, but a smaller thickness. The first body regions 33 are housed within the epitaxial region 28 and are delimited laterally by the second well regions 32. In the example illustrated, the first body regions 33 house two first source regions 34, similarly to what is known in the technology of vertical-conduction MOSFET power devices. In particular, the presence of the second well regions 32 inhibits the lateral parasitic transistors that could be formed between the first well regions 30, the epitaxial region 28 and the first body regions 33. Also the second body regions 35 are housed within the epitaxial region 28 laterally in contact with the first well regions 30. In the example illustrated, the second body regions 35 each house a second source region 36.

Above the top surface 20b, the power device 10 comprises first insulated-gate regions 39, including in a known way an electrode, for example of polycrystalline silicon, surrounded by a dielectric layer, for example of silicon oxide. The respective electrodes of the first insulated-gate regions 39 are coupled to one another and to the control terminal G of the power device 10 (as shown schematically), accessible from outside. In the example illustrated, two first gate regions 39 are present adjacent to one another, extending, in a per-se known manner, above the portions of the first body regions 33 set between the first source regions 34 and the epitaxial region 28, and also partially above the epitaxial region 28 and the first source regions 34. In a substantially similar way, the power device 10 comprises second insulated-gate regions 40, the electrodes of which are also coupled to one another and to the control terminal G of the power device 10. In the example illustrated, two second insulated-gate regions 40 are present, extending, in a per-se known manner, above the portions of the second body regions 35 set between the second source regions 36 and the epitaxial region 28, and also partially above the epitaxial region 28 and the second source regions 36.

The power device 10 further comprises: a cathode metallization 42 extending on the top surface 20b between the first insulated-gate regions 39, in contact with the first body regions 33 and source regions 34, and coupled to the second current-conduction terminal K of the power device 10, accessible from outside; and a floating metallization 44, which is also set on the top surface 20b between respective first and second insulated-gate regions 39, 40, in contact with the second body and source regions 35, 36 and with the first well regions 30, and coupled to the second internal node 16 (FIG. 2) of the power device 10. The floating metallization 44 consequently short-circuits the second source regions 36 and the first well regions 30 adjacent thereto.

Basically, the thyristor 12 is formed by the substrate 22 (anode), the buffer layer 23 (which may not be present) and the drift region 24 (first base), the base region 26 (second base, base terminal accessible from outside), and the cathode region 27 (cathode). The first insulated-gate switch device 14 (MOS transistor) is formed by the cathode region 27 (drain), the epitaxial region 28 and the first body regions 33 (channel), the first source regions 34 (source) and the first insulated-gate regions 39 (gate). The second insulated-gate switch device (IGBT) 18 is formed by the substrate 22 (collector), the drift region 24, the epitaxial region 28 and the second body regions 35 (channel), the second source regions 36 (emitter), and the second insulated-gate regions 40 (gate).

The Zener diode 19 (not shown in the cross section of FIG. 3) can be integrated in the body of semiconductor material 20 using any known technique, for example in the way which will be described in detail hereinafter. In particular, the junction of the Zener diode 19 may be provided by the layers and regions already formed for obtaining the various components described, with an appropriate layout of the power device.

The power device 10 may be manufactured using traditional manufacturing techniques of silicon devices, for example, in the way described hereinafter with reference to FIGS. 4 to 9.

Initially (FIG. 4), the buffer layer 23 and then the drift region 24 are grown epitaxially on the substrate 22; the buffer layer 23 has a reduced thickness (for example, 5-20 μm) and a low resistivity (for example, 1-5Ω·cm), and the drift region 24 has a larger thickness and higher resistivity (determined principally on the basis of the voltage rating of the device—$BV_{AK}$). The epitaxial growth may be performed in a single step, or alternatively, through successive growth steps.

Next (FIG. 5), using an appropriate phototechnique, an implantation of dopant of a P type (for example boron atoms) is carried out followed by a corresponding diffusion to form the base region 26; then, by means of a further phototechnique, an implantation of dopant of an N type (for example As, Sb or P, or a combination thereof) and corresponding diffusion is carried out to form the cathode region 27 within the base region 26. In particular, the cathode region 27 has a smaller width than the base region 26, to enable formation of the first well regions 30 laterally to the cathode region 27.

Figure 6:
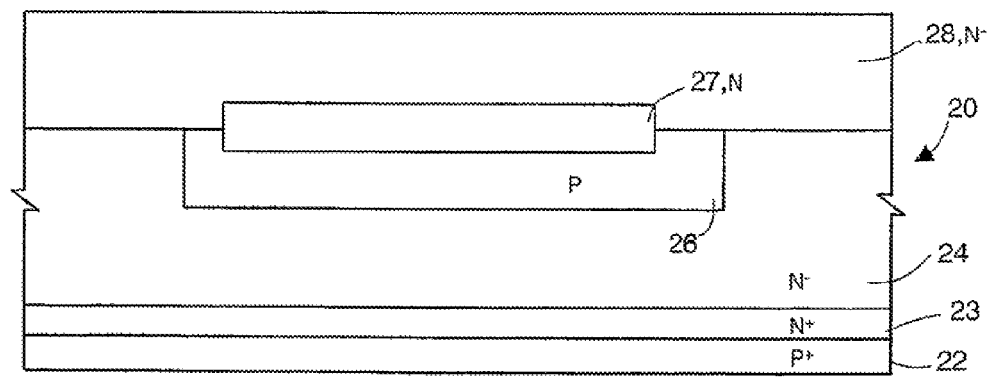
Figure 7:
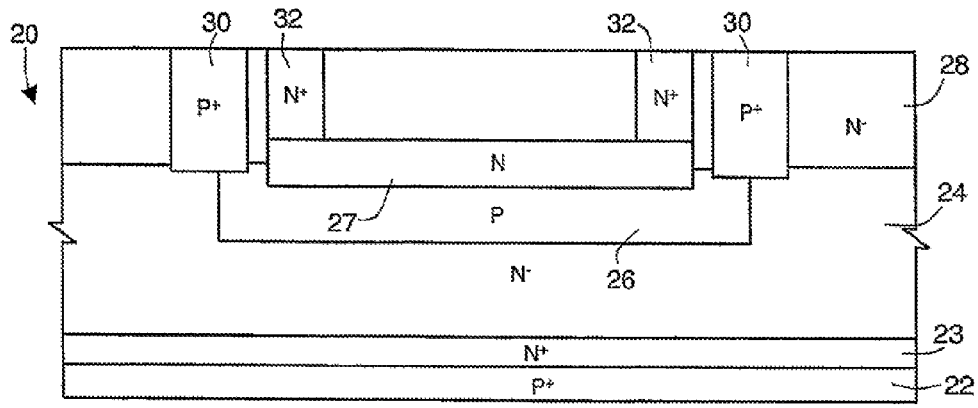
Figure 8:
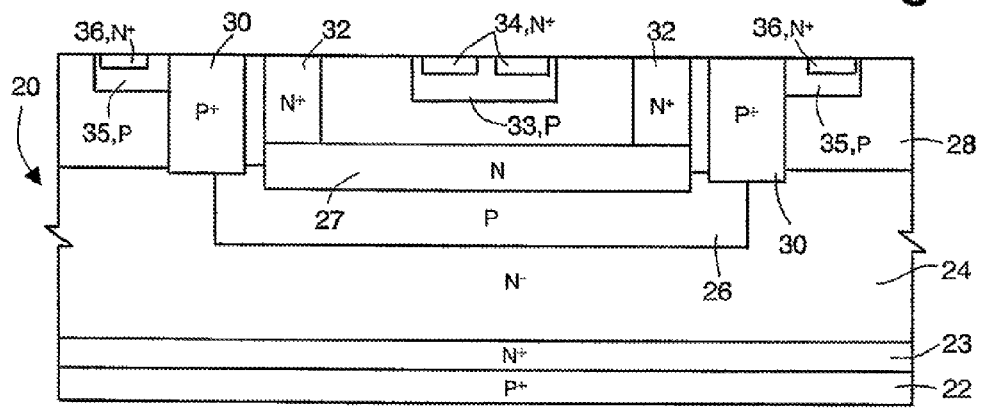

A further epitaxial growth is then carried out to form the epitaxial layer 28 (FIG. 6). The epitaxial layer 28, of an N⁻ type, has a resistivity similar to that of the drift region 24, but a smaller thickness (for example, approximately 5 μm). As shown in FIG. 6, the further epitaxial growth leads to an increase in the thickness of the cathode region 27, which thus extends in part within the epitaxial layer 28.

Next (FIG. 7), the first well regions 30, of a P type, reaching the base region 26, and the second well regions 32, of an N type, reaching the cathode region 27, are implanted and diffused. In a per-se known manner, also a ring of an edge structure (for example of a <<SIPS>> or <<VLD>> type) of the device may be provided.

The process is then completed by providing the body and source regions of the first and second insulated-gate switch devices 14, 18, using standard process steps for manufacturing of vertical-flow DMOS structures. The respective body and source regions, and the respective gate regions and contacts, may be formed simultaneously with the same process steps.

Figure 9:
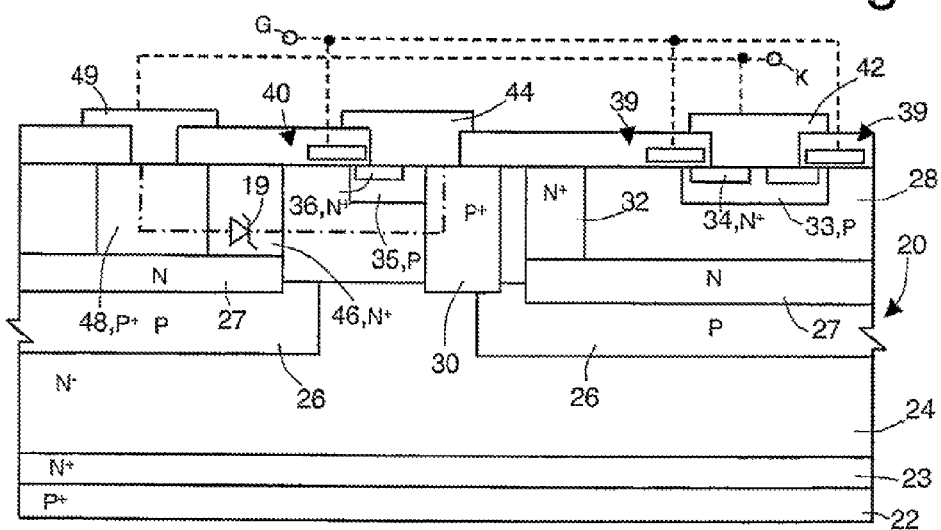
FIG. 9 shows a cross section through an end portion of the power device of FIG. 2, integrating a Zener diode thereof.

FIG. 9 shows a dedicated portion of the power device 10 (in particular, an end portion thereof), in which the Zener diode 19 is provided, in a way substantially similar to what is described in the European patent application No. EP 05425492.5 filed on Jul. 8, 2005, which is incorporated by reference. As it is clear from FIG. 9, the Zener diode 19 is provided without adding any further regions with respect to the manufacturing process of the power-device elementary structure, in particular exploiting the P⁺ and N⁺ well implants and diffusions already present. In detail, the Zener diode 19 is a lateral bipolar transistor with open base having as emitter the first well region 30, of a P⁺ type (coupled to the second internal node 16 via the floating metallization 44), as base a first additional well 46 of an N⁺ type (may be formed simultaneously with the first well regions 30), and as collector a second additional well 48 of a P⁺ type (may be formed simultaneously with the second well regions 32), which is electrically coupled, via a diode metallization 49 arranged above the second surface 20b, to the second current-conduction terminal K. The Zener voltage of the Zener diode 19 is the $BV_{ceo}$ voltage of said lateral transistor.

Figure 10:
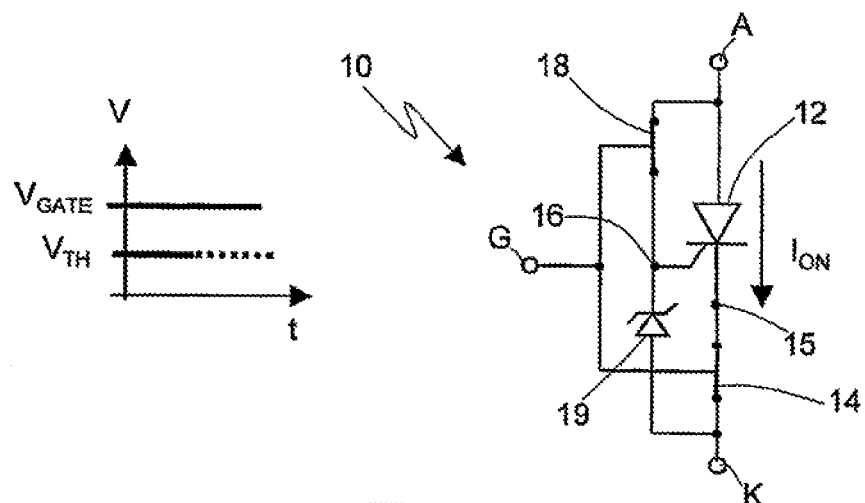
FIGS. 10 and 11 show equivalent electrical circuit diagrams of the power device of FIG. 2 in two different operating conditions, respectively a turn-on and a turn-off condition.
Figure 11:
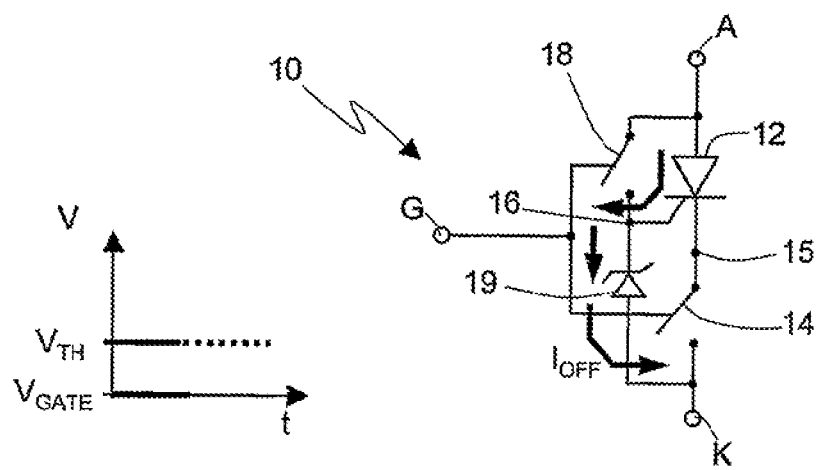

Operation of the power device 10 is now described also with reference to FIGS. 10 and 11, in which, for simplicity of illustration, the first and second insulated-gate switch devices 14, 18 are modelled as two switches, in the closed and open operating conditions, respectively.

In particular, the first insulated-gate switch device 14, set in series with the cathode of the thyristor 12, has a current-cutting function, i.e., it enables or blocks passage of current through the thyristor. The second insulated-gate switch device 18, set between the anode and the base of the thyristor 12, has, instead, the function of enabling turning-on thereof. Since the aforesaid switch devices are of the same type (with an N channel) and have the gate terminal in common, when the control voltage (designated by $V_{GATE}$) exceeds a threshold voltage (designated by $V_{TH}$), as shown in FIG. 10, they are both conducting (closed switches), thus enabling the passage of a current in the thyristor 12. Instead, when the control voltage $V_{GATE}$ is below the threshold voltage $V_{TH}$, as shown in FIG. 11, the two switches open, interrupting the current flow in the thyristor 12.

In detail, in an example of use the first current-conduction terminal A is set at a high positive voltage, whilst the second current-conduction terminal K is set at a reference voltage (ground) so that the anode terminal A is at a higher voltage than the cathode K.

When $V_{GATE}$ is greater than $V_{TH}$, a certain current flows through the second insulated-gate switch device 18, and precisely from its collector region (substrate 22) towards its emitter region (second source region 36). Since the second source region 36 is coupled, via the floating metallization 44, to the first well region 30, the aforesaid current reaches the base region 26 of the thyristor 12. Said current, even though it is not particularly high, is in any case sufficient to trigger the thyristor 12 (in a way similar to traditional thyristors, the triggering current depends upon the common-base gain of the PNP and NPN transistors forming the thyristor), which, once it has been turned on, does not require a further modulation of the driving current. Turn-on of the device causes a flow of current (designated by $I_{on}$) from the first current-conduction terminal A to the second current-conduction terminal K. In the turn-on state, the voltage drop between said terminals is due substantially to the voltage drop across the thyristor 12 (the voltage drop across the first switch device 14 is in fact negligible in so far as it is a low-voltage MOSFET), and is very low. It should be noted that in this situation, the Zener diode 19 (having a non-zero voltage across it, for example higher than 2 V) prevents a direct passage of current between the first current-conduction terminal A and the second current-conduction terminal K that would not enable turn-on of the thyristor 12.

When, instead, $V_{GATE}$ is lower than $V_{TH}$, the first insulated-gate switch device 14 and the second insulated-gate switch device 18 switch off substantially simultaneously, causing turn-off of the power device 10. During the turn-off phase, all the current coming from the first current-conduction terminal A (designated by $I_{off}$), since it cannot circulate in the two switches, is diverted into the base of the thyristor 12, and then, through the Zener diode 19, towards the second current-conduction terminal K. In this way, turn-off of the device is extremely fast (in the region of some hundreds of nanoseconds), without any current tail typical of bipolar-conduction actuator devices of a known type. In fact, all the charges stored in the base regions of the two PNP and NPN transistors forming the thyristor 12 (drift region 24 and base region 26), are forcibly removed, and consequently the anode current drops rapidly to zero. The Zener diode 19 hence enables a selective passage of current between the second internal node 16 and the second current-conduction terminal K, preventing passage of current during the on-phase of the thyristor 12, and enabling said passage of current during the turn-off phase of the thyristor.

Advantages of the power device and of the corresponding manufacturing process according to one or more embodiments of the disclosure are evident from the above description.

In particular, the structure of the device enables a high current density to be obtained, thanks to the presence of a thyristor, and a high switching speed, thanks to the cascode configuration between a thyristor and a MOSFET, with a fast removal by extraction of the base charges during turn-off.

In addition, the device has three terminals (two current-conduction terminals and one control terminal), and is consequently of a "standard" type, easily integrable in traditional technologies.

The power device may not have any parasitic components, so that it may have both a large FBSOA (Forward-Bias Safe-Operating Area) and a large RBSOA.

Basically, the device is a power actuator that is particularly suitable for all those circuit applications in which a high reverse-bias blocking capacity (greater than 1 kV) and a high operating frequency (up to 100 kHz) are required. Finally, it is clear that modifications and variations can be made to what is described and illustrated herein, without thereby departing from the scope of the subject matter disclosed herein.

For example, the charge-extraction terminal in the turn-off phase (second internal node 16) to which the cathode of the Zener diode 19 is coupled could be coupled to another base region of the thyristor 12, in particular to the drift region 24.

In addition, although the vertical structure described in FIG. 3 may extend horizontally in strips with an alternation of strips associated with the first insulated-gate switch device 14 and of strips associated with the second insulated-gate switch device 18, it is evident that also other layouts, of a known type, are equally possible.

The power device 10 may form part of a system in which the power device is coupled to circuitry that is disposed on a same die as the power device, or that is disposed on a different die from the power device.

The invention claimed is:

1. A process for manufacturing a power device, comprising:
   providing a body of semiconductor material having a first surface and a second surface opposite to the first surface;
   forming a first current-conduction terminal above said first surface, and a second current-conduction terminal and a control terminal above said second surface;
   forming, in said body of semiconductor material, a thyristor device and a first insulated-gate switch device coupled in series between said first and said second current-conduction terminals, said first insulated-gate switch device having a gate terminal coupled to said control terminal, and said thyristor device having a base terminal and having an anode terminal coupled to the first current-conduction terminal; and
   forming, in said body of semiconductor material, a second insulated-gate switch device coupled between said first current-conduction terminal and said base terminal of said thyristor device and having a respective gate terminal coupled to said control terminal.

2. The process according to claim 1, further comprising forming, in said body of semiconductor material, a selective current-conduction element coupled between said base terminal of said thyristor device and said second current-conduction terminal, and configured to enable extraction of current from said base terminal of said thyristor device towards said second current-conduction terminal in a given operating condition of said first and second insulated-gate switch devices.

3. A process for manufacturing a power device, comprising:
   providing a body of semiconductor material having a first surface and a second surface;
   forming a first current-conduction terminal above said first surface, and a second current-conduction terminal and a control terminal above said second surface;
   forming, in said body of semiconductor material, a thyristor device and a first insulated-gate switch device coupled in series between said first and said second current-conduction terminals, said first insulated-gate switch device having a gate terminal coupled to said control terminal, and said thyristor device having a base terminal;
   forming, in said body of semiconductor material, a second insulated-gate switch device coupled between said first current-conduction terminal and said base terminal of said thyristor device and having a respective gate terminal coupled to said control terminal; and
   forming, in said body of semiconductor material, a selective current-conduction element coupled between said base terminal of said thyristor device and said second current-conduction terminal, and configured to enable extraction of current from said base terminal of said thyristor device towards said second current-conduction terminal in a given operating condition of said first and second insulated-gate switch devices;
   wherein said selective current-conduction element is a Zener diode, in particular having its anode terminal coupled to said second current-conduction terminal and its cathode terminal coupled to said base terminal of said thyristor device; and wherein said first insulated-gate switch device is a MOSFET, and said second insulated-gate switch device is an IGBT, said MOSFET and IGBT having respective channels with the same type of conductivity.

4. A process for manufacturing a power device, comprising:
   providing a body of semiconductor material having a first surface and a second surface;
   forming a first current-conduction terminal above said first surface, and a second current-conduction terminal and a control terminal above said second surface;
   forming, in said body of semiconductor material, a thyristor device and a first insulated-gate switch device coupled in series between said first and said second current-conduction terminals, said first insulated-gate switch device having a gate terminal coupled to said control terminal, and said thyristor device having a base terminal;
   forming, in said body of semiconductor material, a second insulated-gate switch device coupled between said first current-conduction terminal and said base terminal of said thyristor device and having a respective gate terminal coupled to said control terminal;
   providing a substrate of a first type of conductivity and defining said first surface;
   forming a first base region of a second type of conductivity, on said substrate;
   forming a second base region of said first type of conductivity in said first base region;
   forming a first conductive region of said second type of conductivity on said second base region, said first conductive region defining said second surface;
   forming a first well region of said first type of conductivity, extending from said top surface as far as one of said first and second base regions;
   forming a second conductive region having said second type of conductivity, separated from said first conductive region by a first channel region having said first type of conductivity; and
   forming a third conductive region having said second type of conductivity and separated from said first conductive region by a second channel region having said first type of conductivity, said second and third conductive regions being set laterally and on opposite sides with respect to said first well region, and said second channel region being in contact with said first well region.

5. The process according to claim 4, further comprising:
   forming a first gate electrode and a second gate electrode above, and electrically insulated from, said second surface of said body of semiconductor material and overlying respectively said first and second channel regions;
   connecting said gate electrodes to one another and to said control terminal;
   forming a floating conductive region on said second surface in contact with said third conductive region and said first well region; and connecting said first current-conduction terminal to said substrate region, said second current-conduction terminal to said second conductive region, and said base terminal of said thyristor device to said floating conductive region.

6. A process for manufacturing a power device, comprising:

providing a body of semiconductor material having a first surface and a second surface;

forming a first current-conduction terminal above said first surface, and a second current-conduction terminal and a control terminal above said second surface;

forming, in said body of semiconductor material, a thyristor device and a first insulated-gate switch device coupled in series between said first and said second current-conduction terminals, said first insulated-gate switch device having a gate terminal coupled to said control terminal, and said thyristor device having a base terminal;

forming, in said body of semiconductor material, a second insulated-gate switch device coupled between said first current-conduction terminal and said base terminal of said thyristor device and having a respective gate terminal coupled to said control terminal;

forming, in said body of semiconductor material, a selective current-conduction element coupled between said base terminal of said thyristor device and said second current-conduction terminal, and configured to enable extraction of current from said base terminal of said thyristor device towards said second current-conduction terminal in a given operating condition of said first and second insulated-gate switch devices;

providing a substrate of a first type of conductivity and defining said first surface;

forming a first base region of a second type of conductivity, on said substrate;

forming a second base region of said first type of conductivity in said first base region;

forming a first conductive region of said second type of conductivity on said second base region, said first conductive region defining said second surface; forming a first well region of said first type of conductivity, extending from said top surface as far as one of said first and second base regions;

forming a second conductive region having said second type of conductivity, separated from said first conductive region by a first channel region having said first type of conductivity; and forming a third conductive region having said second type of conductivity and separated from said first conductive region by a second channel region having said first type of conductivity, said second and third conductive regions being set laterally and on opposite sides with respect to said first well region, and said second channel region being in contact with said first well region; and wherein forming said first conductive region comprises forming a buried region overlying said second base region, and growing an epitaxial region on said buried region; further comprising:

forming, at a diode portion of said body of semiconductor material, a third well region having said second type of conductivity and extending through said epitaxial region laterally with respect to said first well region, and a fourth well region having said first type of conductivity and extending through said epitaxial region laterally in contact with said third well region, said first, second and third well regions defining together said selective current-conduction element; and forming a contact region on said second surface, electrically connecting said third well region to said second current-conduction terminal.

7. The process according to claim 2, further comprising forming the power device on a single integrated circuit die.

8. The process according to claim 2, further comprising disposing the power device in an electronic circuit.

9. A method for manufacturing an electronic device, comprising:

forming a body of semiconductor material having a first surface and a second surface opposite to the first surface;

forming a first current-conduction terminal over the first surface, and a second current-conduction terminal and a control terminal over the second surface;

forming, in the body of semiconductor material, a thyristor device and a first insulated-gate switch device coupled between the first and the second current-conduction terminals, the first insulated-gate switch device having a gate terminal coupled to the control terminal, and the thyristor device having a base terminal and having a cathode terminal coupled to the first insulated-gate switch device; and forming, in the body of semiconductor material, a second insulated-gate switch device coupled between the first current-conduction terminal and the base terminal of the thyristor device and having a respective gate terminal coupled to the control terminal.

10. The method of claim 9, further comprising forming a selective current-conduction element in the body of semiconductor material and coupled between the base terminal of the thyristor device and the second current-conduction terminal, the selective current-conduction element configured to enable extraction of current from the base terminal of the thyristor device towards the second current-conduction terminal.

11. The method of claim 10 wherein the extraction of current from the base terminal of the thyristor device occurs only when an operating condition of the first and second insulated-gate switch devices is satisfied.

12. A method of for manufacturing an electronic device, comprising:

forming a body of semiconductor material having a first surface and a second surface;

forming a first current-conduction terminal over the first surface, and a second current-conduction terminal and a control terminal over the second surface;

forming, in the body of semiconductor material, a thyristor device and a first insulated-gate switch device coupled between the first and the second current-conduction terminals, the first insulated-gate switch device having a gate terminal coupled to the control terminal, and the thyristor device having a base terminal;

forming, in the body of semiconductor material, a second insulated-gate switch device coupled between the first current-conduction terminal and the base terminal of the thyristor device and having a respective gate terminal coupled to the control terminal; and forming a selective current-conduction element in the body of semiconductor material and coupled between the base terminal of the thyristor device and the second current-conduction terminal, the selective current-conduction element configured to enable extraction of current from the base terminal of the thyristor device towards the second current-conduction terminal wherein the selective current-conduction element comprises a Zener diode having an anode terminal coupled to the second current-conduction terminal and a cathode terminal coupled to the base terminal of the thyristor device.

13. A method of for manufacturing an electronic device, comprising:
- forming a body of semiconductor material having a first surface and a second surface;
- forming a first current-conduction terminal over the first surface, and a second current-conduction terminal and a control terminal over the second surface;
- forming, in the body of semiconductor material, a thyristor device and a first insulated-gate switch device coupled between the first and the second current-conduction terminals, the first insulated-gate switch device having a gate terminal coupled to the control terminal, and the thyristor device having a base terminal; and
- forming, in the body of semiconductor material, a second insulated-gate switch device coupled between the first current-conduction terminal and the base terminal of the thyristor device and having a respective gate terminal coupled to the control terminal;
- wherein the first insulated-gate switch device comprises a MOSFET, and the second insulated-gate switch device comprises an IGBT, the MOSFET device and IGBT device formed having respective channels with the same type of conductivity.

14. A method of for manufacturing an electronic device, comprising:
- forming a body of semiconductor material having a first surface and a second surface;
- forming a first current-conduction terminal over the first surface, and a second current-conduction terminal and a control terminal over the second surface;
- forming, in the body of semiconductor material, a thyristor device and a first insulated-gate switch device coupled between the first and the second current-conduction terminals, the first insulated-gate switch device having a gate terminal coupled to the control terminal, and the thyristor device having a base terminal;
- forming, in the body of semiconductor material, a second insulated-gate switch device coupled between the first current-conduction terminal and the base terminal of the thyristor device and having a respective gate terminal coupled to the control terminal;
- forming a substrate of a first type of conductivity and defining the first surface;
- forming a first base region of a second type of conductivity, on the substrate;
- forming a second base region of the first type of conductivity in the first base region;
- forming a first conductive region of the second type of conductivity on the second base region, the first conductive region defining the second surface;
- forming a first well region of the first type of conductivity, with a dimension extending from the top surface to one of the first and second base regions;
- forming a second conductive region having the second type of conductivity, separated from the first conductive region by a first channel region having the first type of conductivity; and
- forming a third conductive region having the second type of conductivity and separated from the first conductive region by a second channel region having the first type of conductivity, the second and third conductive regions being set laterally and on opposite sides with respect to the first well region, and the second channel region being in contact with the first well region.

15. The method of claim 14, further comprising: forming a first gate electrode and a second gate electrode above, and electrically insulated from, the second surface of the body of semiconductor material and overlying respectively the first and second channel regions;
- connecting the gate electrodes to one another and to the control terminal; forming a floating conductive region on the second surface in contact with the third conductive region and the first well region;
- coupling the first current-conduction terminal to the substrate region, coupling the second current-conduction terminal to the second conductive region, and coupling the base terminal of the thyristor device to the floating conductive region.

16. The method of claim 14, wherein forming the first conductive region comprises forming a buried region overlying the second base region, and growing an epitaxial region on the buried region.

17. The method of claim 16, further comprising: forming, at a diode portion of the body of semiconductor material, a third well region having the second type of conductivity and extending through the epitaxial region laterally with respect to the first well region, and a fourth well region having the first type of conductivity and extending through the epitaxial region laterally in contact with the third well region, the first, second and third well regions defining together the selective current-conduction element; and
- forming a contact region on the second surface, electrically connecting the third well region to the second current-conduction terminal.

18. The method of claim 9, further comprising forming the electronic device on a single integrated circuit die.

19. The method of claim 9, further comprising disposing the electronic device in an electronic circuit.

* * * * *